US012696793B2

(12) United States Patent
Solas

(10) Patent No.: US 12,696,793 B2
(45) Date of Patent: Jul. 28, 2026

(54) SEMICONDUCTOR DEVICE PACKAGE WITH OPEN SENSOR CAVITY

(71) Applicant: Texas Instruments Incorporated, Dallas, TX (US)

(72) Inventor: Jeffrey Salvacion Solas, Angeles City (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 554 days.

(21) Appl. No.: 18/309,780

(22) Filed: Apr. 29, 2023

(65) Prior Publication Data

US 2024/0363466 A1     Oct. 31, 2024

(51) Int. Cl.

| | |
|---|---|
| *H10W 74/10* | (2026.01) |
| *H10W 72/50* | (2026.01) |
| *H10W 74/01* | (2026.01) |
| *H10W 90/00* | (2026.01) |
| *H10W 72/00* | (2026.01) |

(52) U.S. Cl.
CPC ....... *H10W 74/131* (2026.01); *H10W 74/014* (2026.01); *H10W 72/075* (2026.01); *H10W 72/536* (2026.01); *H10W 72/5363* (2026.01); *H10W 90/756* (2026.01)

(58) Field of Classification Search
CPC ........... H10W 72/536; H10W 72/5363; H10W 72/075; H10W 90/756
See application file for complete search history.

(56) References Cited

U.S. PATENT DOCUMENTS

| | | | |
|---|---|---|---|
| 2012/0228756 A1* | 9/2012 | Kolleth | H10W 74/012 257/E23.181 |
| 2023/0085734 A1* | 3/2023 | Kim | H10F 39/804 257/432 |

OTHER PUBLICATIONS

"HDC2080 Low-Power Humidity and Temperature Digital Sensor", Datasheet, Texas Instruments Incorporated, 2022; retrieved from the world wide web at the uniform resource locator (url):https://www.ti.com/lit/ds/symlink/hdc2080.pdf?ts=1682531688187&ref_url=https%253A%252F%252Fwww.google.com%252F on Apr. 26, 2023.

* cited by examiner

*Primary Examiner* — Timor Karimy
(74) *Attorney, Agent, or Firm* — Dawn Jos; Frank D. Cimino

(57) ABSTRACT

An example semiconductor device package includes a semiconductor die including an environmental sensor on a device side surface mounted to a package substrate; a barrier comprising a polyimide dry film photoresist material surrounding the environmental sensor on the device side surface of the semiconductor die, the barrier having an interior side facing the environmental sensor and having an opposing exterior side; electrical connections between bond pads on the semiconductor die and leads on the package substrate; and mold compound covering portions of the semiconductor die and contacting the exterior side of the barrier, the mold compound covering the electrical connections and portions of the package substrate, with portions of the leads of the package substrate exposed from the mold compound to form terminals of the semiconductor device package, and the environmental sensor in a sensor cavity formed by the barrier and exposed from the mold compound.

12 Claims, 15 Drawing Sheets

671

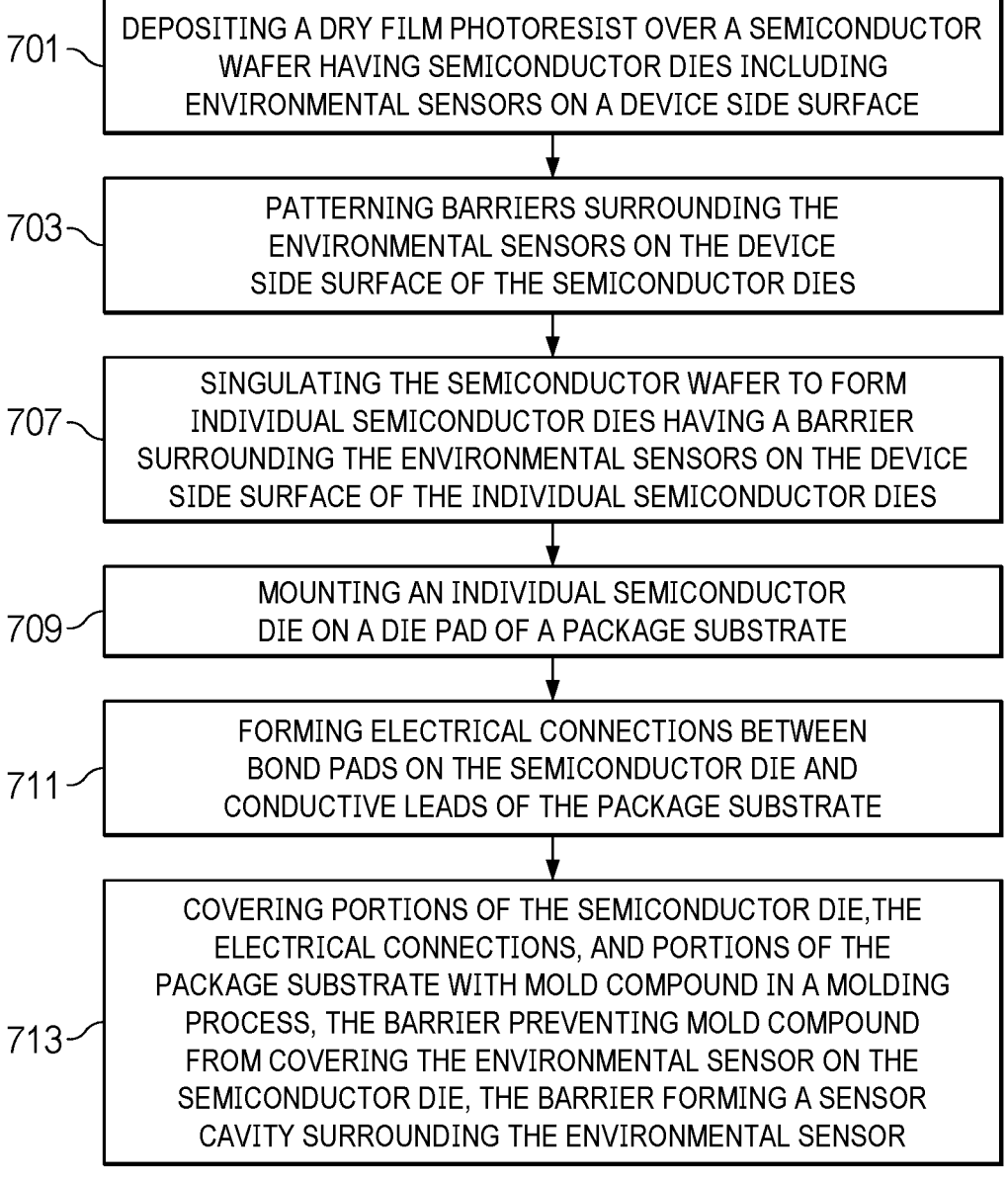

701 — DEPOSITING A DRY FILM PHOTORESIST OVER A SEMICONDUCTOR WAFER HAVING SEMICONDUCTOR DIES INCLUDING ENVIRONMENTAL SENSORS ON A DEVICE SIDE SURFACE

703 — PATTERNING BARRIERS SURROUNDING THE ENVIRONMENTAL SENSORS ON THE DEVICE SIDE SURFACE OF THE SEMICONDUCTOR DIES

707 — SINGULATING THE SEMICONDUCTOR WAFER TO FORM INDIVIDUAL SEMICONDUCTOR DIES HAVING A BARRIER SURROUNDING THE ENVIRONMENTAL SENSORS ON THE DEVICE SIDE SURFACE OF THE INDIVIDUAL SEMICONDUCTOR DIES

709 — MOUNTING AN INDIVIDUAL SEMICONDUCTOR DIE ON A DIE PAD OF A PACKAGE SUBSTRATE

711 — FORMING ELECTRICAL CONNECTIONS BETWEEN BOND PADS ON THE SEMICONDUCTOR DIE AND CONDUCTIVE LEADS OF THE PACKAGE SUBSTRATE

713 — COVERING PORTIONS OF THE SEMICONDUCTOR DIE,THE ELECTRICAL CONNECTIONS, AND PORTIONS OF THE PACKAGE SUBSTRATE WITH MOLD COMPOUND IN A MOLDING PROCESS, THE BARRIER PREVENTING MOLD COMPOUND FROM COVERING THE ENVIRONMENTAL SENSOR ON THE SEMICONDUCTOR DIE, THE BARRIER FORMING A SENSOR CAVITY SURROUNDING THE ENVIRONMENTAL SENSOR

FIG. 7

SEMICONDUCTOR DEVICE PACKAGE WITH OPEN SENSOR CAVITY

TECHNICAL FIELD

This relates generally to semiconductor device packages, and more particularly to semiconductor device packages with an open cavity for a sensor on a semiconductor die.

BACKGROUND

Processes for producing packaged semiconductor devices include mounting semiconductor devices to a package substrate, and covering the semiconductor devices with a mold compound to form semiconductor device packages. Certain semiconductor device dies include environmental sensors for measuring physical characteristics of an ambient environment. For example, an environmental sensor formed on a device side surface of a semiconductor die can include a humidity sensor, a temperature sensor, a light sensor, a pressure sensor, or combinations of these. When a semiconductor die with an environmental sensor is placed in a semiconductor device package, a mold compound may be used to form the body of the semiconductor device package. The mold compound covers a portion of the semiconductor die, portions of a package substrate that supports the semiconductor die, electrical connections from the semiconductor die to leads of the package substrate, and portions of the leads, while some portions of the leads may form be exposed from the mold compound to form terminals for the completed semiconductor device package. For semiconductor device packages including an environmental sensor on the die, a sensor cavity may be formed on a surface of the semiconductor device package to expose the portion of the semiconductor die that includes the environmental sensor to the environment. The mold compound covers other portions of the semiconductor die to protect other circuitry in the semiconductor die.

Forming the sensor cavity in a molding operation can be done by first forming a barrier on or over the semiconductor die that will keep the mold compound from covering the environmental sensor on the semiconductor die. In one approach, a metal plating operation is used to form a barrier on the semiconductor dies on a semiconductor wafer. The barrier surrounds the environmental sensors on the semiconductor dies to prevent mold compound from covering the environmental sensors in a molding operation. The metal plating operations require deposition of a seed layer, a photoresist deposition and exposure to form a pattern, electroless or electroplating of the metal using the pattern, a photoresist strip, and a seed layer etch. These steps increase cost and complexity in the semiconductor manufacturing process. In addition, the uniformity of the metal barrier formed in the plating processes can vary widely, creating possible defects where mold compound flows past the barrier or over a low spot in the barrier.

An improved semiconductor device package with a sensor cavity, and methods of assembly for the semiconductor device package that reduces costs and simplifies the processes is needed.

SUMMARY

An example semiconductor device package includes a semiconductor die including an environmental sensor on a device side surface mounted to a package substrate; a barrier comprising a polyimide dry film photoresist material surrounding the environmental sensor on the device side surface of the semiconductor die, the barrier having an interior side facing the environmental sensor and having an opposing exterior side; electrical connections between bond pads on the semiconductor die and leads on the package substrate; and mold compound covering portions of the semiconductor die and contacting the exterior side of the barrier, the mold compound covering the electrical connections and portions of the package substrate, with portions of the leads of the package substrate exposed from the mold compound to form terminals of the semiconductor device package, and the environmental sensor in a sensor cavity formed by the barrier and exposed from the mold compound.

An example method includes: depositing a dry film photoresist over a semiconductor wafer having semiconductor dies including environmental sensors on a device side surface; using the dry film photoresist, patterning barriers surrounding the environmental sensors on the device side surface of the semiconductor dies; singulating the semiconductor wafer to form individual semiconductor dies having a barrier surrounding the environmental sensors on the device side surface of the individual semiconductor dies; mounting an individual semiconductor die on a die pad of a package substrate; forming electrical connections between bond pads on the semiconductor die and conductive leads of the package substrate; and covering portions of the semiconductor die, the electrical connections, and portions of the package substrate with mold compound in a molding process, the barrier preventing mold compound from covering the environmental sensor on the semiconductor die, the barrier forming a sensor cavity surrounding the environmental sensor.

An additional example method includes: depositing a dry film photoresist over a device side surface of semiconductor dies on a semiconductor wafer; patterning the dry film photoresist to form barriers on the device side surface of the semiconductor dies, the barriers having interior sides surrounding environmental sensors on the device side surface of the semiconductor dies; singulating the semiconductor dies from the semiconductor wafer to from individual semiconductor dies/The method continues by mounting the individual semiconductor dies on die pads of a metal lead frame, the metal lead frame having leads spaced from the die pads; connecting bond pads on the device side surface of the semiconductor dies to the leads using bond wires in a wire bonding tool; and covering a portion of the device side surface of the semiconductor die, the bond wires, and a portion of the lead frame with mold compound, a portion of the leads exposed from the mold compound and forming terminals for a semiconductor device package, the exterior sides of the barriers contacting the mold compound, the interior sides of the barriers surrounding the environmental sensors on the semiconductor dies.

BRIEF DESCRIPTION OF THE DRAWINGS

FIG. 7 illustrates, in a flow diagram, a method for forming an arrangement.

DETAILED DESCRIPTION

Figure 1:
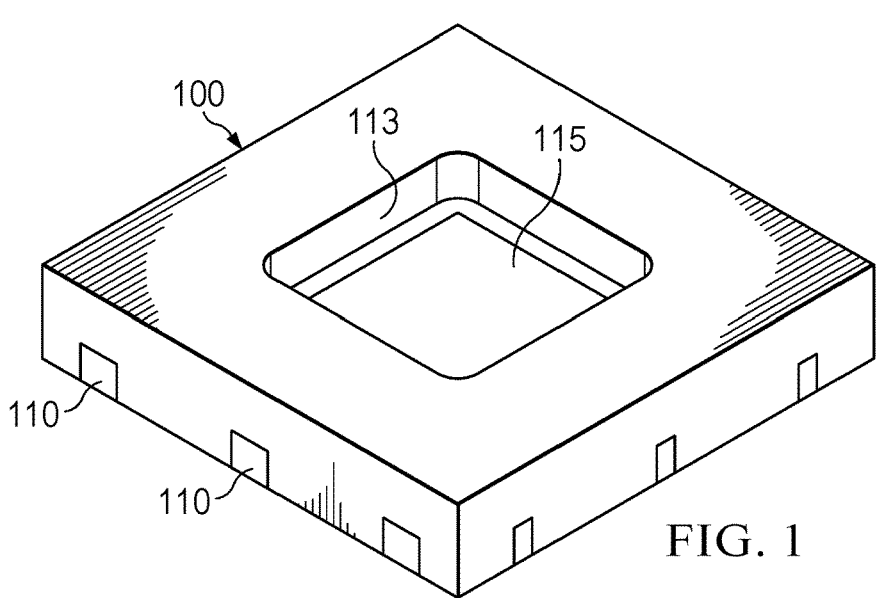
FIG. 1 illustrates, in a projection view, a semiconductor device package with an environmental sensor on a semiconductor die.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as one or a pair of power FET switches fabricated together on a single semiconductor die, or a semiconductor die can be an integrated circuit with multiple semiconductor devices such as multiple capacitors used in an A/D converter. The semiconductor die can include passive devices such as resistors, inductors, filters, capacitors, diodes or active devices such as transistors. The semiconductor die can be an integrated circuit with hundreds or thousands of transistors coupled to form a functional circuit, for example for a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD). The semiconductor die includes a semiconductor substrate that has a device side surface and an opposite backside surface. Semiconductor processes form the devices on the device side surface of the semiconductor die.

The term "environmental sensor" is used herein. An environmental sensor is a sensor that measures a physical characteristic of the environment the sensor is in by exposure to the environment. In example arrangements, the semiconductor die has an environmental sensor formed on a device side surface which, when exposed to the ambient environment, takes a measurement of a physical characteristic. Example environmental sensors used in arrangements are temperature sensors, pressure sensors, humidity sensors and photosensors.

The term "semiconductor device package" is used herein. A semiconductor device package has at least one semiconductor die electronically coupled to terminals and has a body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or controller device die) can be packaged together to from a single packaged electronic device. Additional components such as passives can be included in the packaged electronic device. The semiconductor die can be mounted to a package substrate that provides conductive leads, a portion of the conductive leads form the terminals for the semiconductor device package. The semiconductor die can be wire bonded with the device side surface facing away from a package substrate surface, and the semiconductor die is electrically coupled to the leads of the package substrate by wire bonds or ribbon bonds that are bonded to bond pads on the semiconductor die and to the conductive leads. The semiconductor device package can have a body formed by a thermoset epoxy resin in a molding process (sometimes the thermoset epoxy resin is referred to as "electronic mold compound" or "EMC"), or by the use of epoxy, plastics, or resins that are liquid at room temperature and are subsequently cured. The package body may provide a hermetic package for the packaged semiconductor device. The package body may be formed in a mold using an encapsulation process, however, a portion of the leads of the package substrate are not covered during encapsulation, these exposed lead portions provide the terminals for the semiconductor device package. In example arrangements, a portion of the semiconductor die includes an environmental sensor that is exposed in a sensor cavity from the mold compound to allow the sensor to sense the ambient environment.

The term "package substrate" is used herein. A package substrate is a substrate arranged to receive a semiconductor die and to support the semiconductor die in a completed semiconductor device package. Package substrates include conductive lead frames, which can be formed from copper, aluminum, stainless steel and alloys such as Alloy 42 and copper alloys. Lead frames useful with the arrangements can include plated, stamped and partially etched lead frames. In a partially etched lead frame, two levels of metal with differing patterns can be formed by etching a pattern from one side of a metal substrate configured for lead frames, and then etching from the other side, to form full thickness and partial thickness portions. In some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as flame retardant 4 (FR4) can be used as the package substrates.

Alternative package substrates include pre-molded lead frames (PMLF) and molded interconnect substrates (MIS) for receiving semiconductor dies. Multiple layer substrates, which include multiple levels of conductors in dielectric material, can be used. These package substrates can include dielectrics such as Ajinomoto build up film (ABF), thermoplastics such as ABS, liquid crystal polymer (LCP), or mold compound, and can include one or more layers of patterned conductive portions in the dielectrics. Repeated plating and patterning can form multiple layers of conductors spaced by dielectrics, and layers having conductive vias connecting the conductor layers through the dielectrics.

A package substrate, such as a lead frame, has conductive portions on a device side surface. Leads of a metal lead frame can be conductive all along the surfaces, while for other substrate types, conductive lands in dielectric substrate material are arranged and aligned to electrically connect to the devices. Bond wires can be used to couple a semiconductor die bond pads to the leads of the lead frame or other package substrate.

In packaging semiconductor devices, mold compound may be used to partially cover a package substrate, to cover the semiconductor die, and to cover the electrical connections from the semiconductor die to the package substrate. This "encapsulation" process is often a transfer molding process, where thermoset mold compound such as epoxy resin can be used. A room temperature solid or powder mold compound can be heated to a liquid state and then molding can be performed. Unit molds shaped to surround an individual device may be used, or block molding may be used, to form the packages simultaneously for several devices using molten mold compound. The devices can be provided in an array of several, hundreds or even thousands of devices in rows and columns that are molded together. After molding, the individual semiconductor device packages are cut from each other in a sawing operation by cutting through the mold compound and package substrate in saw streets formed between the devices. Portions of the package substrate leads are exposed from the mold compound to form terminals for the semiconductor device packages. In the arrangements, the mold compound is blocked by a barrier during molding to form a sensor cavity exposing an environmental sensor on the semiconductor die. The barrier can be circular, oval, square or rectangular from a plan view, and during molding the barrier prevents the mold compound from flowing over the environmental sensor on the semiconductor die, forming a sensor cavity in the body of the package. In an example arrangement the barrier has sides that are normal relative to the plane of the device side surface of the semiconductor die. The exterior sides face away from the environmental sensor and contact the mold compound, while the interior sides of the barrier face the environmental sensor and form a surface of the sensor cavity. As used herein, a barrier side with an angle of between 60 and 120 degrees is considered as a "normal" angle with respect to the device side surface of the semiconductor die, with the variations due to manufacturing tolerances. In an alternative arrangement, the barrier has stairstep sides on the exterior side surfaces in contact with the mold compound, these arrangements can have increased adhesion to the mold compound, preventing voids and defects.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are angled with respect to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A "small outline transistor" package or "SOT" package can be used with the arrangements. SOT packages can have terminals that extend a small distance from the package body, and in an example arrangement, the terminals are on a board side surface of the SOT package and are configured to be surface mounted to a system board or module using surface mount technology (SMT) to form solder connections.

In the arrangements, a semiconductor die has an environmental sensor formed on a device side surface that is configured to sense a physical characteristic of the environment. Example sensors useful in arrangements include relative humidity sensors, temperature sensors and pressure sensors. In operation these sensors are exposed to the ambient environment. The semiconductor device packages of the arrangements have a sensor cavity, an opening in the mold compound of the package body, that exposes the environmental sensor on the semiconductor die. In example arrangements, a barrier that bounds the sensor cavity is formed from dry film photoresist, a polyimide material.

In an example method arrangement, a wafer has semiconductor dies with sensors on a device side surface. A layer of dry film photoresist is applied over the wafer by lamination, for example by rolling sheet material over the wafer while heat and pressure are applied. A photomask is used to form barrier patterns in the dry film photoresist, which is then developed and stripped. The wafer is then singulated into individual dies. An individual die is mounted to a package substrate, such as a lead frame. Wire bonds are formed connecting bond pads on the semiconductor die to leads of the lead frame. A molding operation is performed to cover the semiconductor die with mold compound, however during molding the barriers prevent the mold compound from covering the sensor on the semiconductor die, so that a sensor cavity is formed in the semiconductor device package. The environmental sensor is exposed in the sensor cavity, so that the ambient atmosphere is in contact with the sensor. In an example the barrier can have vertical sides relative to the surface of the semiconductor die. In another example arrangement, the barrier can have stepped exterior sides formed using a grayscale photomask, to further increase adhesion of the mold compound to the barriers formed from the polyimide of the dry film photoresist.

Use of the arrangements reduces costs and increases uniformity of the barriers, in experiments the barriers formed have less than +/−5 microns variation in a thickness of about 168 microns, or about 3 percent, compared to up to 20 percent for metal plated barriers used in prior approaches. The methods used to form the barriers in the arrangements do not require seed layer depositions, metal plating steps, and seed layer etch processes, lowering costs.

FIG. 1 illustrates, in a projection view, a semiconductor device package with a sensor cavity. The semiconductor device package 100 has a body formed from electronic mold compound (EMC), which can be a thermoset epoxy resin. Terminals 110 are formed from leads of a package substrate that are exposed from the mold compound. A sensor cavity 113 is shown with an environmental sensor 115 exposed in the sensor cavity 113.

Figure 2A:
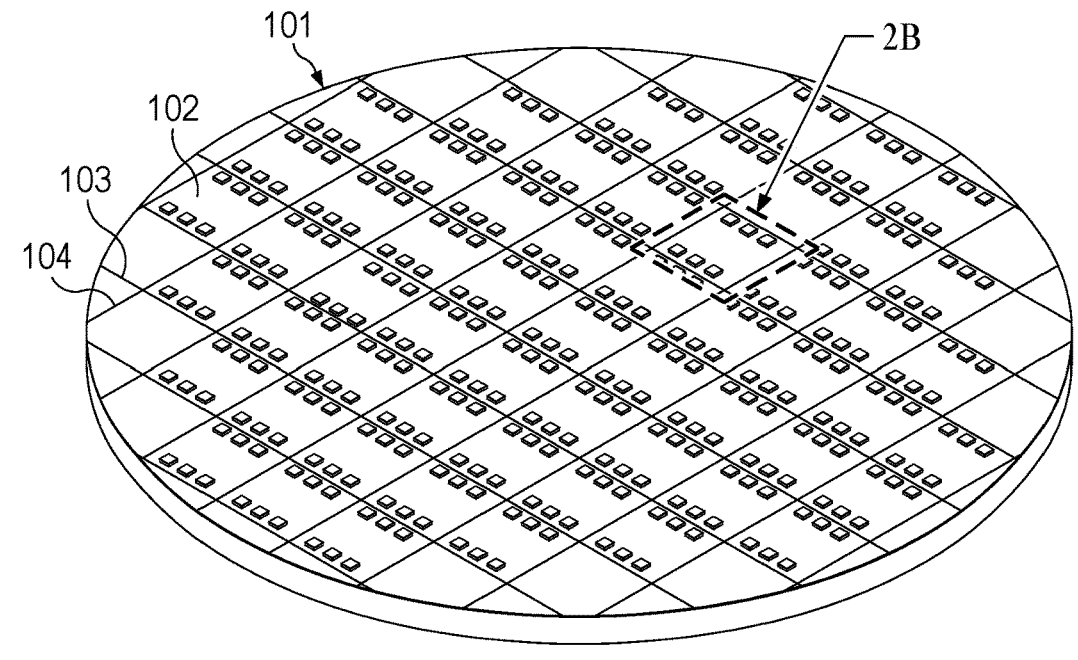
FIGS. 2A-2B illustrate in two projection views a semiconductor wafer including semiconductor dies and an individual semiconductor die separated from the semiconductor wafer, respectively.

FIG. 2A illustrates a semiconductor wafer 101 shown with an array of semiconductor dies 102 in rows and columns formed on a device side surface of the semiconductor wafer 101. The semiconductor dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. Vertical and horizontal (as the semiconductor wafer is oriented in FIG. 2A) scribe lanes 103 and 104, which are perpendicular to one another and which run in parallel groups across the wafer, separate the rows and columns of the completed semiconductor dies 102, and provide areas for dicing the wafer to separate the semiconductor dies 102 from one another.

Figure 2B:
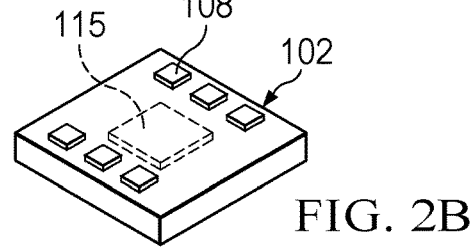

FIG. 2B illustrates an individual semiconductor die 102 form FIG. 2A, with bond pads 108, which are conductive pads that are electrically coupled to devices formed in the semiconductor die 102.

Figure 3:
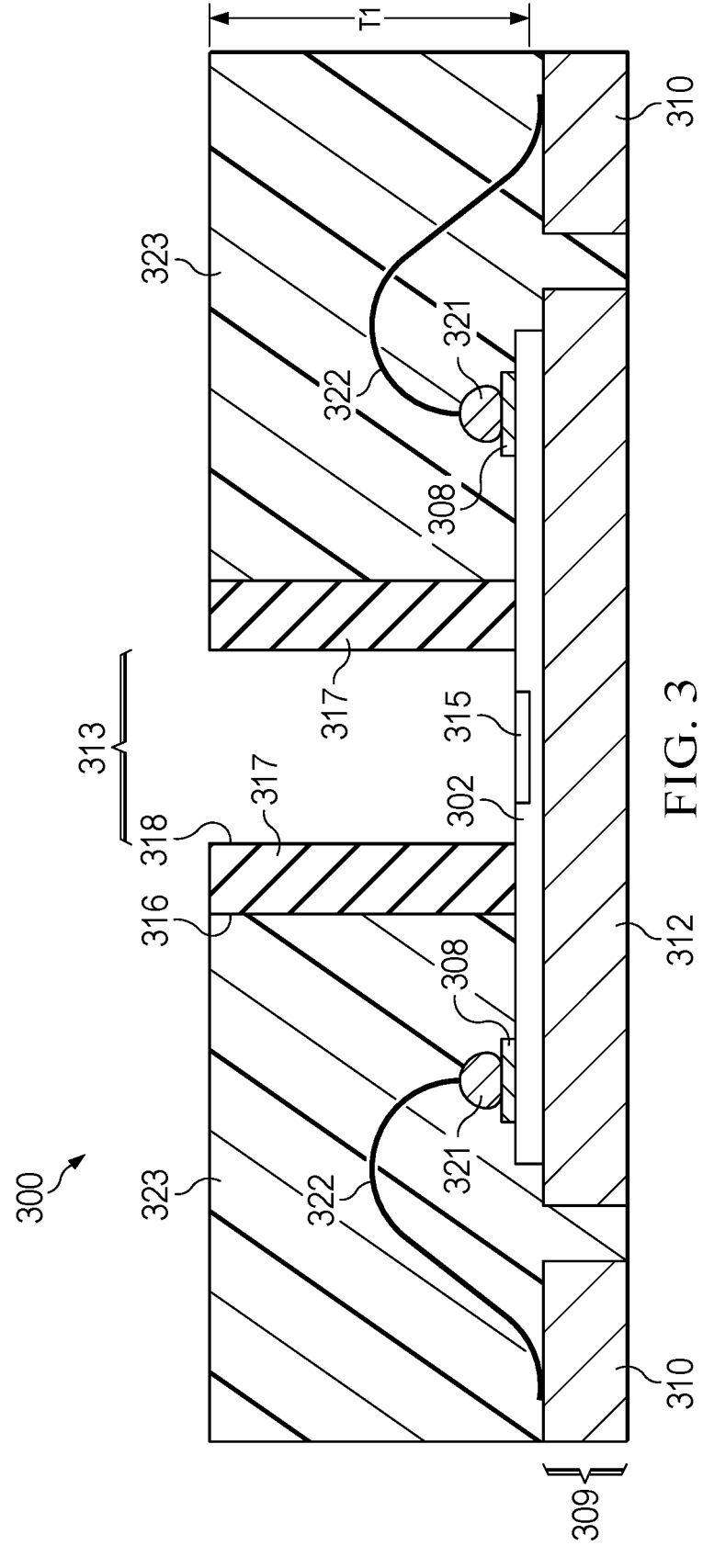
FIG. 3 illustrates, in a cross-sectional view, an example arrangement for a semiconductor device package with a sensor cavity.

FIG. 3 illustrates in a cross-sectional view, a semiconductor device package 300 in an example arrangement. In FIG. 3, a barrier 317 is formed of a polyimide. The barrier 317 is formed on a device side surface of a semiconductor die 302 with an environmental sensor 315 on the device side surface. The barrier 317 has interior sides facing the environmental sensor 315, and exterior sides contacting mold compound 323. The mold compound 323 covers the bond wires 322, and portions of a lead frame 309. The bond wires are connected to the semiconductor die using ball bonds 321 formed on bond pads 308 of the semiconductor die, and the bond wires are stitch bonded to the terminals 310, which are part of the lead frame 309. The terminals 310 are leads of the lead frame 309 that are partially exposed from the mold compound 323. The semiconductor die 302 is mounted on the die pad 310 by a die attach material (not shown for clarity of illustration).

The barrier 317 can be an oval, circular, square, or rectangular shape when viewed from above, and forms a sensor cavity 313 with the environmental sensor 315 exposed from the semiconductor device package 300 in the sensor cavity 313. In an example, the barrier 317 has a thickness T1 of about 168 microns. Other thicknesses can be used, the barrier 317 has a thickness sufficient to prevent the mold compound 323 from covering the environmental sensor 315 during a transfer molding process. The barrier 317 has interior sides 316 that face the environmental sensor 315, and exterior sides 318 that contact the mold compound 323. In the arrangement of FIG. 3, the interior sides and exterior sides are normal to the device side surface of the semiconductor die 402, and are shown as vertical sides as the elements are oriented in FIG. 3.

Figure 4A:
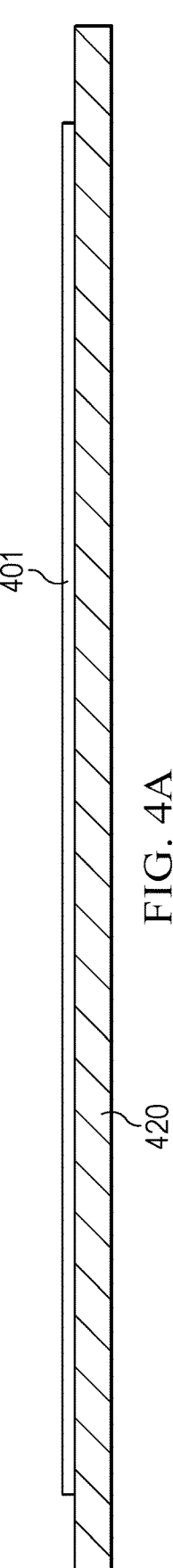
FIGS. 4A-4D illustrate, in a series of views, selected steps of a method for forming barriers used for forming sensor cavities in example arrangements.

FIGS. 4A-4D illustrate in a series of steps an example method for forming barriers used in semiconductor device packages of the arrangements. In FIG. 4A, the method begins by placing a semiconductor wafer 301 on a wafer support 420, which can be a wafer chuck. The semiconductor wafer 301 includes semiconductor dies with environmental sensors, similar to the semiconductor wafer 101 and semiconductor die 102 in FIGS. 2A and 2B.

Figure 4B:
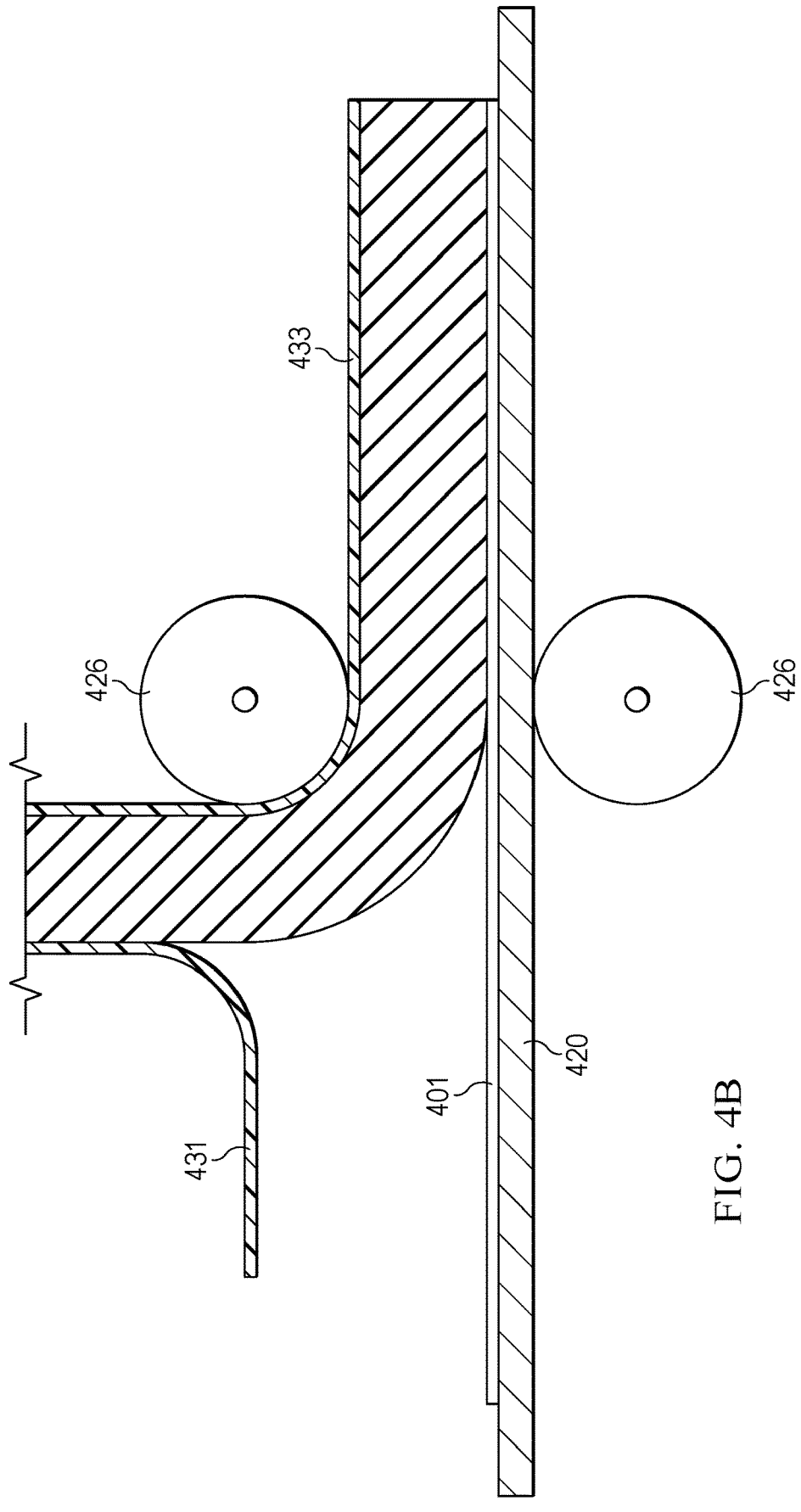

FIG. 4B illustrates deposition of a dry film photoresist over the semiconductor wafer 401. The dry film photoresist 416 is provided as roll material with polyethylene protective films 431 and 433, which can be removed. As the dry film photoresist 416 is rolled onto the semiconductor wafer 401 the bottom film 431 is removed. The dry film photoresist 416 is laminated onto the device side surface of the semiconductor wafer 401 using pressure and heat from the rollers 426. The upper film 433 can be left in place during exposure of the dry film photoresist 416, which is UV sensitive, and removed prior to development steps.

Figure 4C:
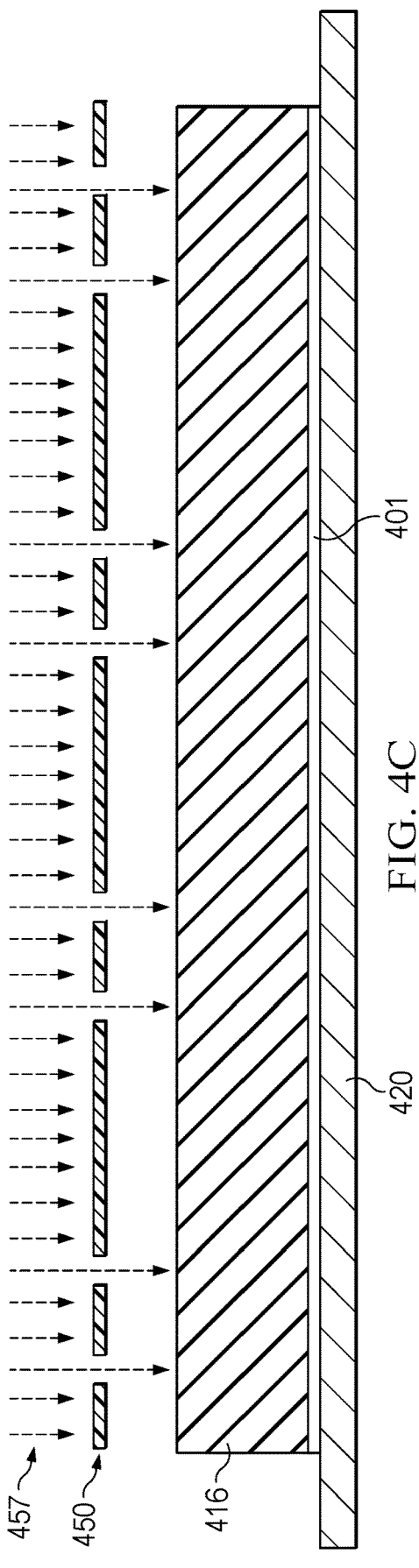

FIG. 4C illustrates the semiconductor wafer 401 and the dry film photoresist 416 during an exposure process using a photomask 450 to form a barrier pattern. In the example shown in FIG. 4C, the barrier pattern has vertical sides. As described below, in alternative arrangements, a grayscale photomask can be used instead, and barriers with stepped sides can be formed. The light 457 used can be, in an example, an ultra-violet (UV) frequency light. The light used and other process variables such as cure temperatures and time, and the developers used, vary with the type of dry film photoresist used. Many commercially available dry film photoresists that can be used with the arrangements are available from DuPont, 874 Centre Road, Wilmington, Delaware 19805 USA, for example.

Figure 4D:
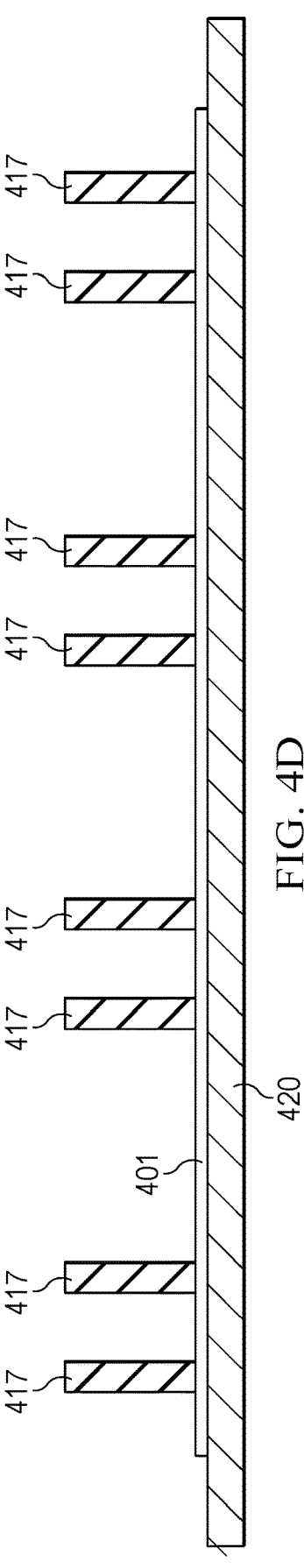

FIG. 4D illustrates, in another cross section, the semiconductor wafer 401 with the barriers 417 formed by the exposure and development of the dry film photoresist 416 shown in FIGS. 4B-4C. The barriers 417 are a polyimide. In this example, the barriers are rectangular in cross section and have sides that are normal to the device side surface of the semiconductor wafer 401. After the barriers 417 are formed, the semiconductor wafer 401 can be singulated and individual semiconductor dies can be separated form the semiconductor wafer 401.

FIGS. 5A-5E illustrate, in a series of views, an example method for forming semiconductor device packages of the arrangements including the barriers formed using the steps of FIGS. 4A-4D.

Figure 5A:
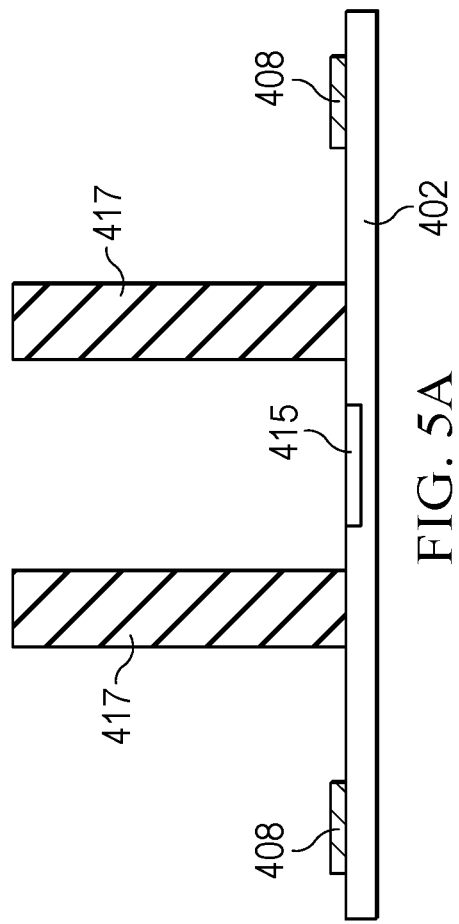
FIGS. 5A-5E illustrate, in a series of cross-sectional views, selected steps used in manufacturing a semiconductor device package with a sensor cavity of the arrangements.

In FIG. 5A, an individual semiconductor die 402 is shown with the barrier 417 formed on the device side surface. Bond pads 408 are shown on the device side surface of the semiconductor die 402, and the environmental sensor 415 is shown.

Figure 5B:
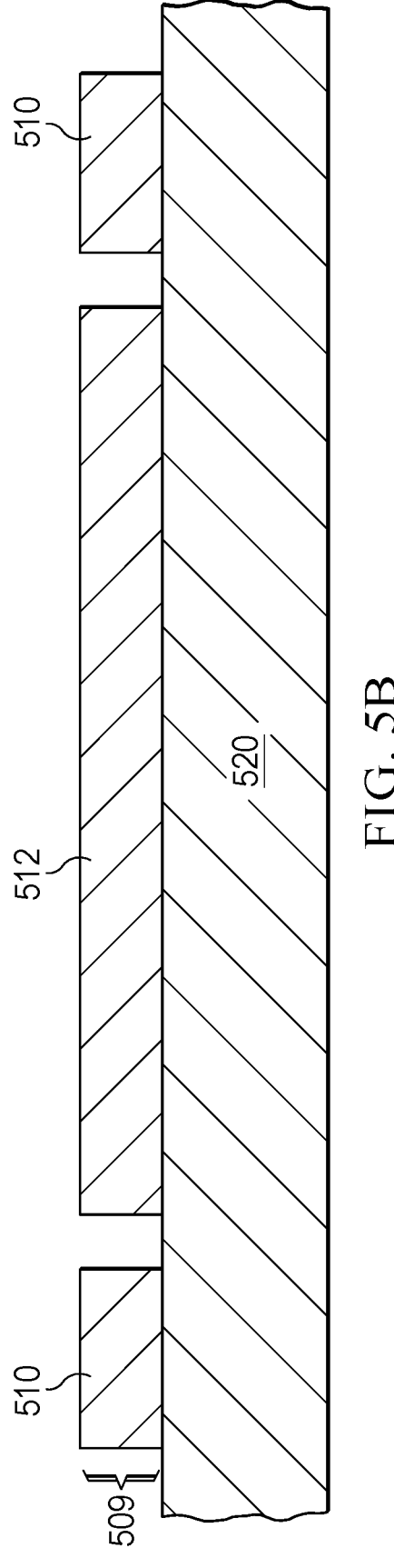

In FIG. 5B, a lead frame 509, similar to lead frame 309 in FIG. 3, is shown on a support 520. The lead frame 509 has a die pad 512, and leads 510. While a single unit lead frame 509 is shown in FIG. 5B for simplicity of illustration, in a manufacturing process the lead frame 509 can be provided in strips of arrays of unit lead frames, to increase throughput, and many semiconductor dies 402 are processed simultaneously.

Figure 5C:
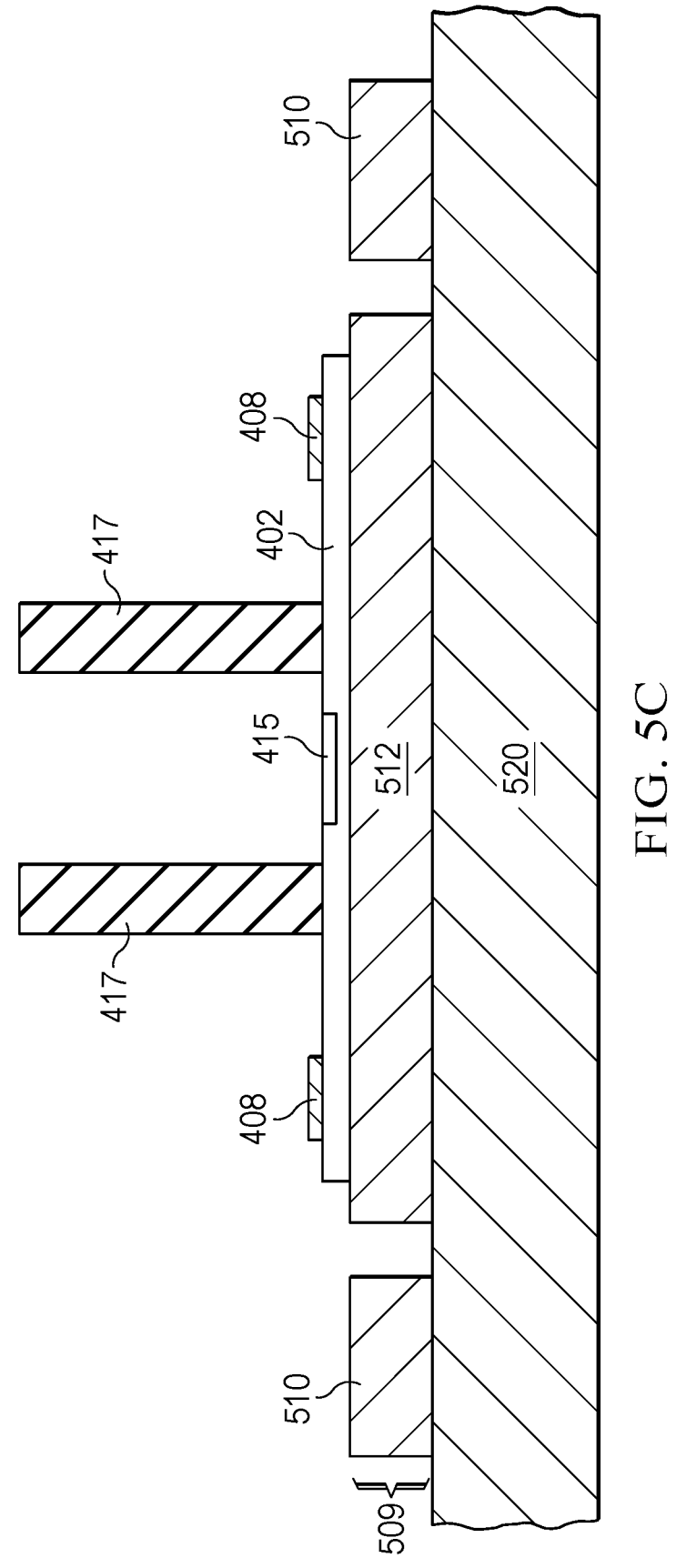

FIG. 5C illustrates the semiconductor die 402 after a die mounting process places the semiconductor die 402 on the die pad 512 on the lead frame 509. The environmental sensor 415, barrier 417 and bond pads 408 are shown on the semiconductor die 402.

Figure 5D:
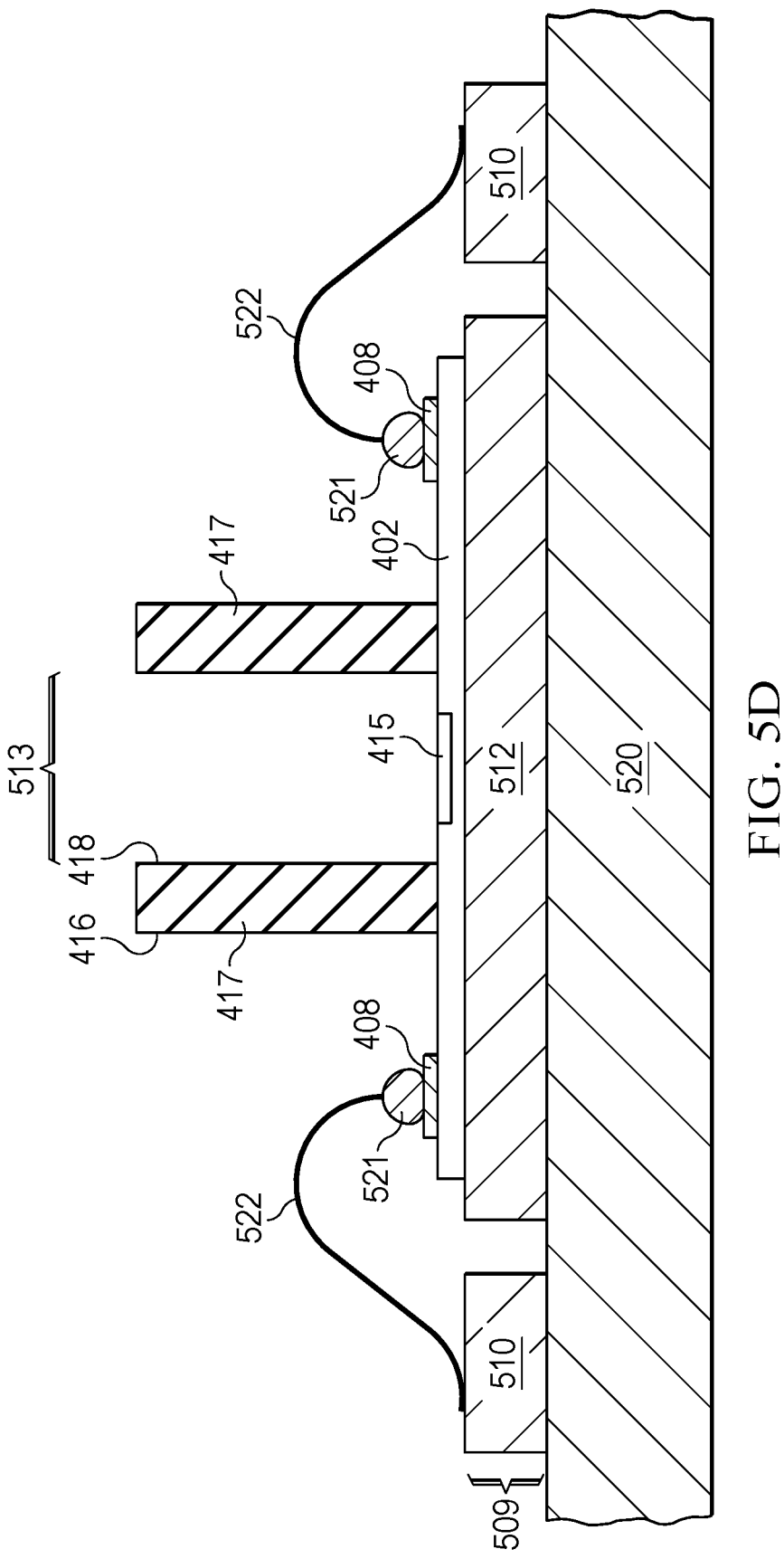

FIG. 5D illustrates the semiconductor die 402 and lead frame 509 after a wire bonding operation. Semiconductor die 402 is shown with bond wires 522 forming electrical connections between the bond pads 408 and the terminals 510. Bond wires 522 are connected to bond pads 408 by a ball bonding operation. In a wire bonding process, a wire bonding tool has a capillary with bond wire extending from an opening. A flame or electric arc is used to form a free air ball on an exposed end of the bond wire. The capillary uses mechanical pressure, ultrasonic vibration and the devices are heated to form ball bonds 521 between the molten ball on the bond wire and the metal bond pad 408. The capillary of the wire bonding tool then moves over a terminal 510, and the bond wire extends from the ball bond. A stitch bond is formed on the terminals 510 by use of mechanical pressure, ultrasonic vibration and heat. The capillary then breaks the bond wire as it moves to a new position, and the bonding cycle is repeated for each wire bond connection 522.

Figure 5E:
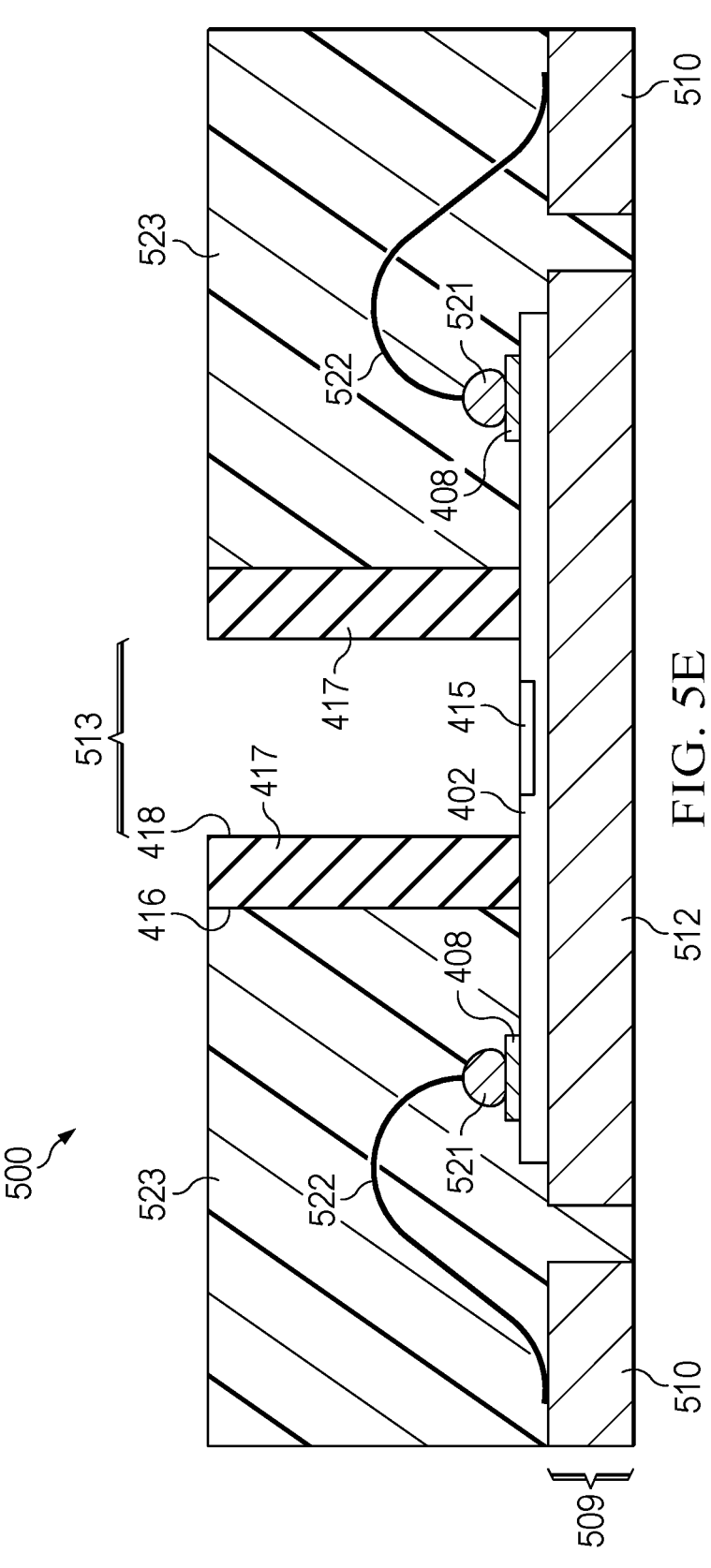

At FIG. 5E, a cross-sectional view of the semiconductor die 402 is shown after a molding process completes the process forming semiconductor device package 500. Mold compound 523 can be formed using transfer molding, where a thermoset epoxy resin mold compound is heated to a liquid state and transferred through runners to a mold chase. The mold compound 523 is prevented from covering the environmental sensor 415 by barrier 417, and a sensor cavity 513 is formed with interior sides 416 of barrier 417 surrounding the environmental sensor 415. The mold compound 523 covers the remaining device side surface of the semiconductor die 402, the bond wires 522, portions of the lead frame 509. The mold compound 523 is in contact with the exterior sides 418 of the barrier 417, and forms the body of the semiconductor device package that protects the semiconductor die 402. After the molding process is complete, a sawing operation that saws along saw streets between the molded semiconductor device packages separates the semiconductor device packages one from another.

In the example arrangement of FIG. 5E, the barrier 417 is shown with smooth exterior sides that contact the mold compound 523. However, to increase adhesion of the mold compound to the barrier, other shapes and features can be used. The barrier can be formed in two layers to create a ledge or step. The barrier can include "mold lock" features (not shown) such as divots, trenches, or holes formed in the exterior sides of the barrier 417 that contact the mold compound 523 and increase adhesion of the mold compound to the barrier.

Figure 6A:
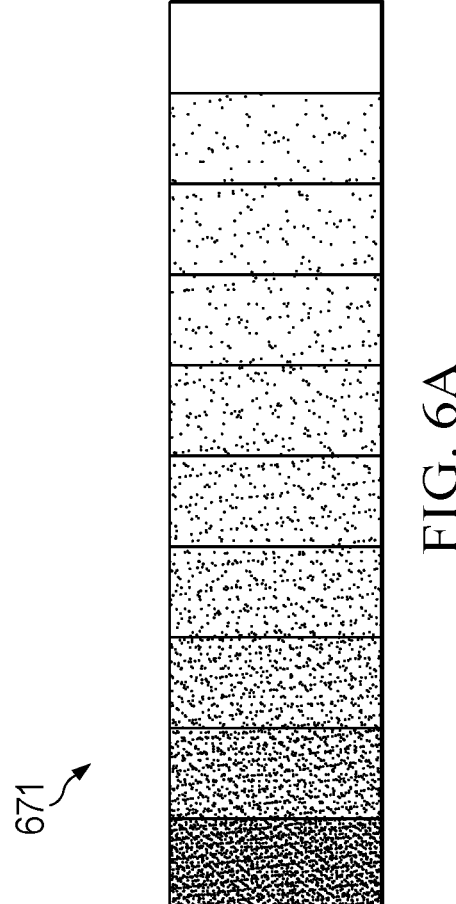
FIG. 6A illustrates, in a top view, a photomask with a grayscale pattern.

FIG. 6A illustrates a portion of a grayscale photomask. In an alternative arrangement, the barrier (see 417 in FIG. 5E, for example) can be shaped to have staggered exterior sides, using a grayscale photomask during exposure (see FIG. 4C for comparison, where a standard photomask 450 is used). In FIG. 6A, a grayscale photomask 671 is shown with a solid portion at one end (left end in FIG. 6A) and a series of successively less dense patterns moving to an open section at the opposing end (right end in FIG. 6A).

Figure 6B:
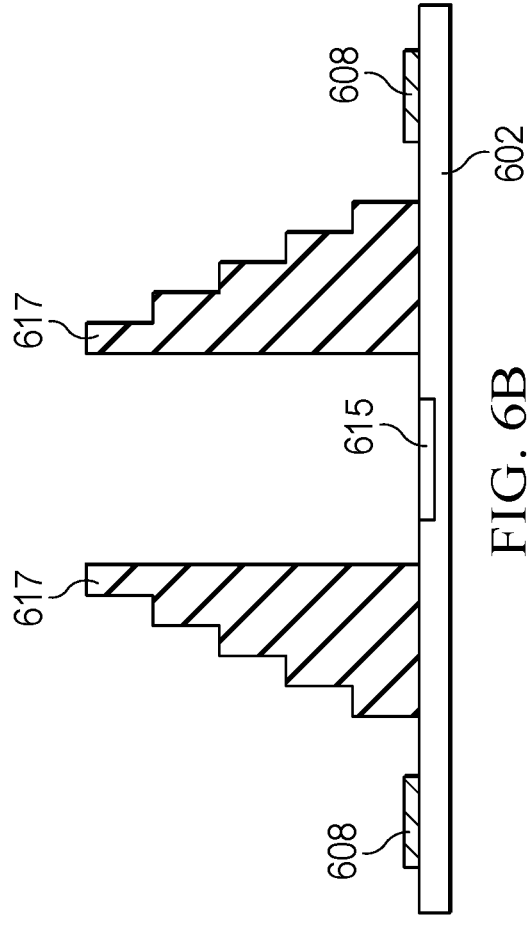
FIG. 6B illustrates in a cross-sectional view, an alternative barrier used in example arrangements that can be formed using a grayscale photomask such as shown in FIG. 6A.

FIG. 6B illustrates, in a cross section, an alternative barrier 617 formed on a semiconductor die 602 with an environmental sensor 615 and bond pads 608 on the device side surface of the semiconductor die 602. The barrier 617 can be formed using a dry film photoresist with a grayscale photomask such as shown in FIG. 6A during exposure steps (see FIG. 4C, above). The barrier 617 has staggered exterior sides, with interior sides facing the environmental sensor 615 that are vertical, or normal with respect to the device side surface of the semiconductor die 602.

Figure 6C:
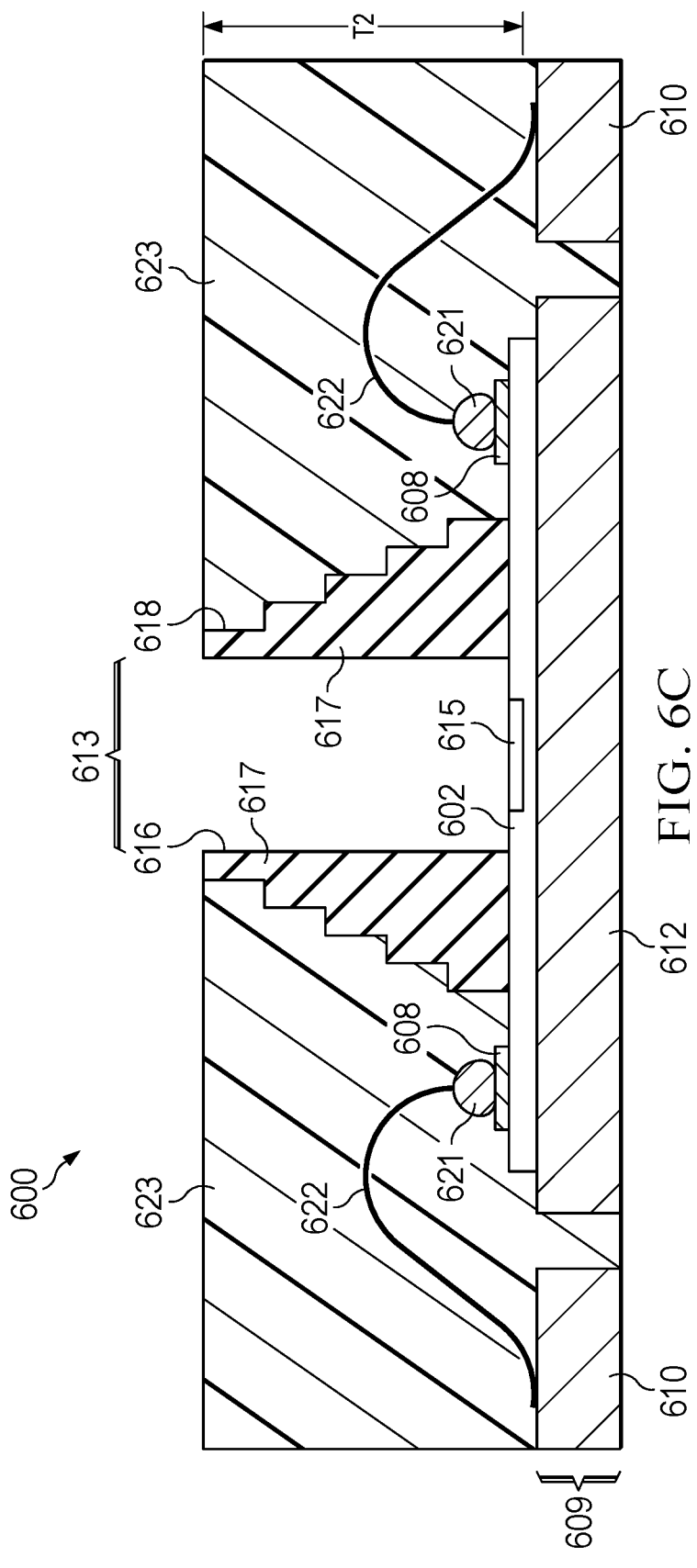
FIG. 6C illustrates in a cross-sectional view an example arrangement for a semiconductor device package formed with a sensor cavity using the alternative barrier of FIG. 6B.

FIG. 6C illustrates, in another cross section, a semiconductor device package 600 formed with the barrier 617 shown in FIG. 6B. Semiconductor die 602 is shown mounted on a die pad 612 of a lead frame 609. The bond pads 608 of the semiconductor die 602 are connected to the leads 610 by the bond wires 622, bond wires 622 are bonded to the bond pads 608 by ball bonds 621 and stitch bonded to the terminals 610, which are leads of the lead frame 609 that are partially exposed form the mold compound 623. The barrier 617 has staggered exterior sides 618 that are in contact with the mold compound 623. The exterior sides of barrier 617, when viewed from a cross-sectional view, include multiple steps that are approximately 90 degree angled with respect to the device side surface of semiconductor die 602. The barrier 617 has vertical interior sides 616 facing the environmental sensor 615. The staggered sides 618 of the barrier 617 can increase the adhesion of the mold compound 623 to the barrier 617 when compared to the barrier 417 in FIG. 5E, for example. Other barrier shapes can be formed, such as sloping ramp exterior sides.

The barrier 617 has a thickness T2 in an example of about 168 microns. However, various thicknesses can be used, the barrier 617 should be of sufficient thickness to prevent mold compound 623 from covering the environmental sensor 615.

FIG. 7 illustrates, in a flow diagram, selected steps of the methods described above for forming the arrangements. In FIG. 7, the method begins at step 701 by depositing a dry film photoresist over a semiconductor wafer having semiconductor dies including environmental sensors on a device side surface. (See FIGS. 4A-4B, where the dry film photoresist 416 is shown being deposited on semiconductor wafer 401).

The method of FIG. 7 then continues to step 703. At step 703, the method continues by patterning barriers surrounding the environmental sensors on the device side surface of the semiconductor dies. (See, for example, the barriers 417 in FIG. 4D, and the exposure step shown on dry film photoresist 416 in FIG. 4C).

At step 707, the method of FIG. 7 continues by singulating the semiconductor wafer to form individual semiconductor dies having a barrier surrounding the environmental sensors on the device side surface of the individual semiconductor dies. (See the individual semiconductor die 402 in FIG. 5A with barrier 417).

At step 709, the method of FIG. 7 continues by mounting an individual semiconductor die on a die pad of a package substrate. (See, for example, the semiconductor die 402 mounted on die pad 512 on the lead frame 509 in FIG. 5C).

The method continues to step 711, forming electrical connections between bond pads on the semiconductor die and conductive leads of the package substrate. (See, for example, bond wires 522 in FIG. 5D, connecting the bond pad 408 and the terminals 510 of the lead frame 509, the bond wires are bonded to the bond pads 408 by ball bond 521, the barrier 417 is shown surrounding the environmental sensor 415).

The method continues at step 713, where mold compound is formed covering portions of the semiconductor die, the electrical connections, and portions of the package substrate with mold compound in a molding process, the barrier preventing mold compound from covering the environmental sensor on the semiconductor die, the barrier forming a sensor cavity surrounding the environmental sensor.

The use of the arrangements produces semiconductor device packages with sensor cavities using barriers that are most cost effective and of greater uniformity than semiconductor device packages of prior approaches. The arrangements are formed using semiconductor packaging processes and materials that are well known and cost effective, so that the arrangements can be adopted without the need for specialized tooling or materials.

Modifications are possible in the described arrangements, and other alternative arrangements are possible within the scope of the claims.

11

What is claimed is:

1. A method, comprising:

depositing a dry film photoresist over a semiconductor wafer having semiconductor dies including environmental sensors on a device side surface;

using the dry film photoresist, patterning barriers surrounding the environmental sensors on the device side surface of the semiconductor dies;

singulating the semiconductor wafer to form individual semiconductor dies having a barrier surrounding the environmental sensors on the device side surface of the individual semiconductor dies;

mounting an individual semiconductor die on a die pad of a package substrate;

forming electrical connections between bond pads on the semiconductor die and conductive leads of the package substrate; and covering portions of the semiconductor die, the electrical connections, and portions of the package substrate with mold compound in a molding process, the barrier preventing mold compound from covering the environmental sensor on the semiconductor die, the barrier forming a sensor cavity surrounding the environmental sensor.

2. The method of claim 1, wherein the environmental sensor is exposed from the mold compound in the sensor cavity.

3. The method of claim 1 wherein mounting the individual semiconductor die on the package substrate further comprises mounting the individual semiconductor die on the die pad of a conductive lead frame.

4. The method of claim 3, wherein forming electrical connections further comprises performing wire bonding using bond wire by performing ball bonding to bond pads on the semiconductor die and by performing stitch bonding to leads on the lead frame.

5. The method of claim 1, wherein covering portions of the semiconductor die, the electrical connections, and portions of the package substrate with mold compound further comprises molding with thermoset epoxy resin mold compound.

6. The method of claim 1, wherein patterning barriers further comprises patterning barriers having a rectangular or square cross section.

7. The method of claim 1, wherein patterning barriers further comprises patterning barriers using a grayscale photomask.

8. The method of claim 7, wherein patterning barriers further comprises forming barriers having a staggered exterior side in contact with the mold compound, and having interior sides facing the environmental sensor that are at a normal angle relative to the device side surface of the semiconductor die.

9. The method of claim 1, wherein the environmental sensor is a relative humidity sensor, a temperature sensor, a pressure sensor or a photosensor.

10. A method, comprising:

depositing a dry film photoresist over a device side surface of semiconductor dies on a semiconductor wafer;

patterning the dry film photoresist to form barriers on the device side surface of the semiconductor dies, the barriers having interior sides surrounding environmental sensors on the device side surface of the semiconductor dies;

singulating the semiconductor dies from the semiconductor wafer to from individual semiconductor dies;

mounting the individual semiconductor dies on die pads of a metal lead frame, the metal lead frame having leads spaced from the die pads;

connecting bond pads on the device side surface of the semiconductor dies to the leads using bond wires in a wire bonding tool; and covering a portion of the device side surface of the semiconductor die, the bond wires, and a portion of the lead frame with mold compound, a portion of the leads exposed from the mold compound and forming terminals for a semiconductor device package, the exterior sides of the barriers contacting the mold compound, the interior sides of the barriers surrounding the environmental sensors on the semiconductor dies.

11. The method of claim 10, wherein patterning the dry film photoresist to form barriers further comprises patterning to form the barriers with exterior sides and with interior sides that are at a normal angle relative to the device side surface of the semiconductor dies.

12. The method of claim 10, wherein patterning the dry film photoresist to form barriers comprises patterning using a grayscale photomask to form the barriers with staggered exterior sides and having interior sides that are at a normal angle relative to the device side surface of the semiconductor dies.

* * * * *